United States Patent [19]
Banno

[11] Patent Number: 5,739,709
[45] Date of Patent: Apr. 14, 1998

[54] PHASE FREQUENCY DETECTING CIRCUIT

[75] Inventor: Noriyuki Banno, Tokyo, Japan

[73] Assignee: Ando Electric Co., Ltd., Tokyo, Japan

[21] Appl. No.: 721,053

[22] Filed: Sep. 26, 1996

[30] Foreign Application Priority Data

Sep. 27, 1995 [JP] Japan .................................. 7-273424

[51] Int. Cl.$^6$ ............................ H03D 13/00; H03L 7/087
[52] U.S. Cl. ............................ 327/156; 327/147; 331/11; 331/17
[58] Field of Search .................................. 331/11, 14, 15, 331/17; 327/147–150, 156–159, 3, 7, 8; 375/375, 376

[56] References Cited

U.S. PATENT DOCUMENTS 3,815,042  6/1974  Maunsell et al. .......................... 331/11
4,605,908  8/1986  Broughton ................................ 331/17
4,940,952  7/1990  Kegasa .................................... 331/14

Primary Examiner—Timothy P. Callahan
Assistant Examiner—T. T. Lam
Attorney, Agent, or Firm—Finnegan, Henderson, Farabow, Garrett & Dunner, L.L.P.

[57] ABSTRACT

A phase frequency detecting circuit is designed to produce an output voltage which varies with respect to an input phase difference between a base phase and a reference phase. Herein, a first phase frequency comparator produces a first phase error signal which is proportional to the input phase difference. A first integration circuit performs integration on the first phase error signal to produce a control voltage. Next, a second phase frequency comparator receives a frequency-divided base phase and a frequency-divided reference phase to produce a second phase error signal. A second integration circuit performs integration on the second phase error signal to produce a frequency-divided control voltage. An offset voltage creating circuit creates an offset voltage. Herein, the offset voltage is created based on the frequency-divided control voltage; and a sign thereof is determined responsive to a relationship between the control voltage and frequency-divided control voltage. An offset imparting circuit adds the offset voltage to the frequency-divided control voltage, then, the addition result is amplified to produce the output voltage. Incidentally, an amplifier can be further provided to produce an amplified output voltage based on the frequency-divided control voltage. The amplified output voltage is used instead of the frequency-divided control voltage and is delivered to the offset voltage creating circuit and offset imparting circuit.

8 Claims, 8 Drawing Sheets

PHASE FREQUENCY DETECTING CIRCUIT

BACKGROUND OF THE INVENTION

1. Field of the Invention

The invention relates to phase frequency detecting circuits which detect a difference between phases applied thereto.

2. Prior Art

The phase frequency detecting circuits are applicable to phase synchronization circuits and angle-modulation phase synchronization circuits, for example.

An example of the phase frequency detecting circuit is shown in FIG. 7 and is configured by a phase frequency comparator 1 and an integration circuit 3. The phase frequency comparator 1 inputs a base phase 11a and a reference phase 12a. Thus, the phase frequency comparator 1 outputs a phase error signal 1a which is proportional to an input phase difference between the phases 11a and 12a. The integration circuit 3 performs integration on the phase error signal 1a to produce a control voltage 3a.

An input/output characteristic of the phase frequency detecting circuit of FIG. 7 is shown in FIG. 8. In FIG. 8, a horizontal axis represents an input phase difference 1b using the unit of radians (rad), while a vertical axis represents the control voltage 3a. $\theta_1$ represents a range of the input phase difference 1b at which the control voltage 3a is zero. This range lies in proximity to zero radian of the input phase difference 1b. $V_2$ represents a maximum value of the control voltage 3a. In general, the range₁ is called a dead zone and is very small.

The input phase difference 1b forms discontinuous points at $+\pi$ (rad) and $-\pi$ (rad). A characteristic of the input phase difference 1b, which emerges in a range between $+\pi$ (rad) and $-\pi$ (rad), is repeated with respect to a range of phases which are smaller than $-\pi$ (rad) as well as a range of phases which are larger than $+\pi$ (rad). An interval between the discontinuous points is $2\pi$ (rad) in FIG. 8. However, this value of the interval is a general value; therefore it can be set at an arbitrary value. A minimum value of the control voltage 3a is '$-V_2$' whose sign is reverse to a sign of the maximum value '$+V_2$'.

In a phase range between $+\pi$ (rad) and $-\pi$ (rad), the control voltage 3a is basically proportional to the input phase difference 1b. However, in the range $\theta_1$, the control voltage 3a is zero; therefore it is impossible to detect the input phase difference 1b. The range $\theta_1$ is limited by operating frequencies of the phase frequency comparator 1.

FIG. 9 shows an example of the phase synchronization circuit which employs the phase frequency detecting circuit of FIG. 7. In addition to circuit elements of FIG. 7, the phase synchronization circuit of FIG. 9 is configured using an independent oscillator 11 and a dependent oscillator 12.

The independent oscillator performs oscillation using a constant frequency so as to impart the base phase 11a to the phase frequency comparator 1. An oscillation frequency of the dependent oscillator 12 is controlled by the control voltage 3a, so that the dependent oscillator 12 imparts the reference phase 12a to the phase frequency comparator 1. The control voltage 3a is used to equalize the base phase 11a outputted from the independent oscillator 11 with the reference phase 12a outputted from the dependent oscillator 12.

When the base phase 11a is equalized with the reference phase 12a so that the phase synchronization circuit of FIG. 9 is put in a phase-synchronized state, the input phase difference 1b becomes zero so that the control voltage 3a becomes zero. If the reference phase 12a fluctuates between the positive and negative within the range $\theta_1$, for example, the control voltage 3a remains at zero; therefore, it is impossible to detect the input phase difference 1b. For this reason, the reference phase 12a outputted from the dependent oscillator 12 may contain a large amount of jitter.

Next, FIG. 10 shows an example of the angle-modulation phase synchronization circuit which employs the phase frequency detecting circuit of FIG. 7. In addition to the circuit elements of the aforementioned phase synchronization circuit of FIG. 9, the angle-modulation phase synchronization circuit of FIG. 10 is configured using an angle-modulation oscillator 13 and an addition circuit 14.

Like the phase synchronization circuit of FIG. 9, the reference phase 12a outputted from the dependent oscillator 12 shown in FIG. 10 may contain a large amount of jitter. Due to a modulation signal 13a outputted from the angle-modulation oscillator 13, the dependent oscillator 12 is subjected to angle modulation which is either frequency modulation or phase modulation. Due to the modulation signal 13a, the input phase difference 1b changes to the positive or negative. However, a characteristic of the input phase difference 1b does not have good linearity in the range $\theta_1$. So, modulation distortion may occur.

The configuration of the phase frequency detecting circuit described above suffers from a problem that the input phase difference 1b cannot be detected with respect to the range $\theta_1$ within the phase range between $+\pi$ (rad) and $-\pi$ (rad) because the control voltage 3a is zero in the range $\theta_1$. So, if the aforementioned phase frequency detecting circuit is applied to the phase synchronization circuit, the reference phase 12a fluctuates, for example. Therefore, even if the input phase difference 1b fluctuates between the positive and negative in the range $\theta_1$, the control voltage 3a remains at a zero level, so that the input phase difference 1b cannot be detected. This causes a problem that the reference phase 12a outputted from the dependent oscillator 12 may contain a large amount of jitter. Although the phase frequency detecting circuit is applied to the angle-modulation phase synchronization circuit, much jitter occurs. So, this causes a problem that modulation distortion may occur due to poor linearity of the characteristic of the input phase difference 1b in the range $\theta_1$.

SUMMARY OF THE INVENTION

It an object of the invention to provide a phase frequency detecting circuit whose input-phase-difference characteristic is improved in linearity in a phase range close to zero.

A phase frequency detecting circuit of the invention is designed to produce an output voltage which varies with respect to an input phase difference between a base phase and a reference phase. Herein, a first phase frequency comparator produces a first phase error signal which is proportional to the input phase difference. A first integration circuit performs integration on the first phase error signal to produce a control voltage.

Next, a frequency-divided base phase is produced by performing phase inversion and frequency dividing operation on the base phase, while a frequency-divided reference phase is produced by performing frequency dividing operation on the reference phase.

A second phase frequency comparator receives the frequency-divided base phase and frequency-divided reference phase to produce a second phase error signal. A second integration circuit performs integration on the second phase error signal to produce a frequency-divided control voltage. Then, an offset voltage creating circuit creates an offset voltage. Herein, the offset voltage is created based on the frequency-divided control voltage; and a sign thereof is determined responsive to a relationship between the control voltage and frequency-divided control voltage. An offset imparting circuit adds the offset voltage to the frequency-divided control voltage, then, the addition result is amplified to produce the output voltage.

The aforementioned frequency dividing operations are determined such that a frequency of the frequency-divided control voltage becomes substantially half of the frequency of the control voltage, for example.

Incidentally, an amplifier can be further provided to produce an amplified output voltage based on the frequency-divided control voltage. The amplified output voltage is used instead of the frequency-divided control voltage and is delivered to the offset voltage creating circuit and offset imparting circuit.

Thus, the phase frequency detecting circuit has an improved input/output characteristic, wherein linearity of the output voltage is improved with respect to the input phase difference which exists in proximity to zero.

Moreover, when the phase frequency detecting circuit is applied to the phase synchronization circuit wherein the reference phase is produced by a dependent oscillator whose oscillation frequency is controlled by the output voltage, it is possible to reduce an amount of jitter which occurs in the reference phase. When the phase frequency detecting circuit is applied to the angle-modulation phase synchronization circuit, it is possible to reduce an amount of jitter of the reference phase; and it is possible to avoid occurrence of modulation distortion.

BRIEF DESCRIPTION OF THE DRAWINGS

These and other objects of the subject invention will become more fully apparent as the following description is read in light of the attached drawings wherein.

DESCRIPTION OF THE PREFERRED EMBODIMENTS

Figure 1:
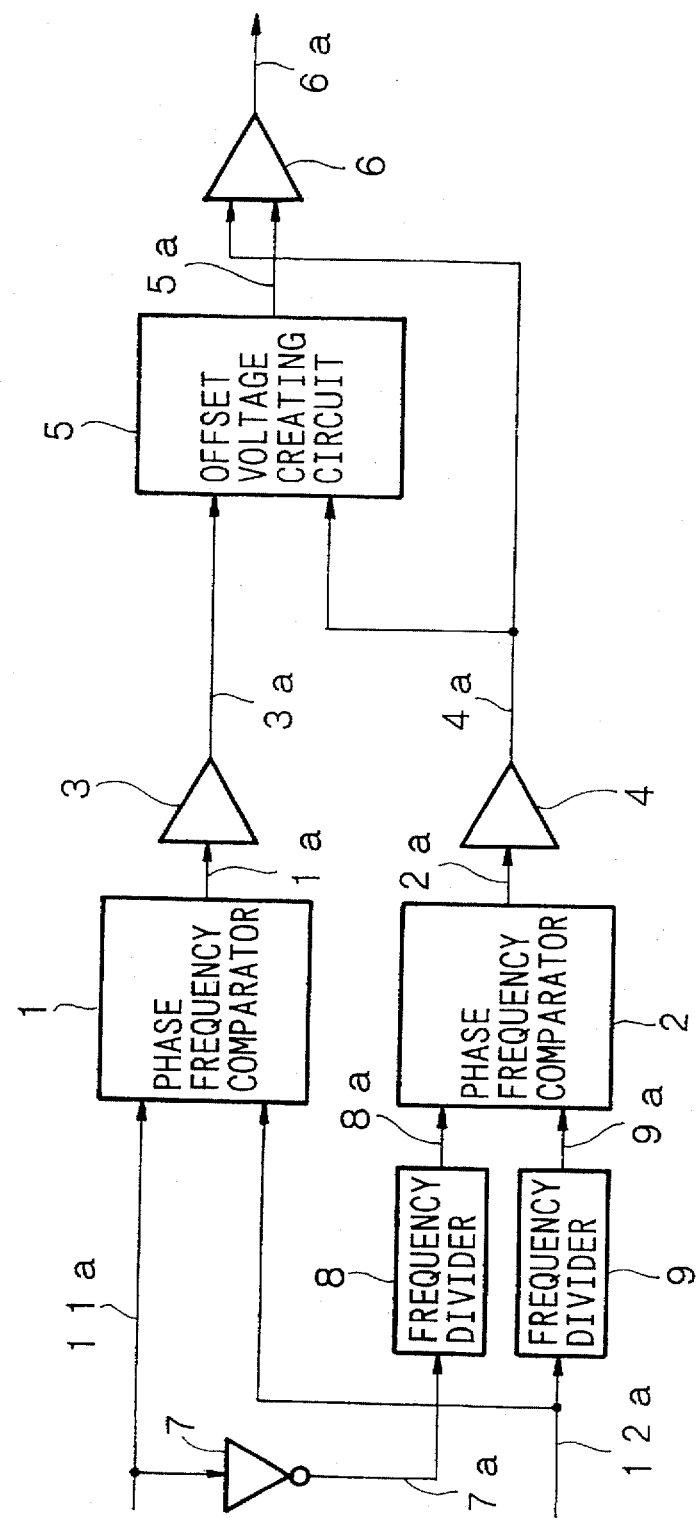
FIG. 1 is a block diagram showing a configuration of a phase frequency detecting circuit which is designed in accordance with an embodiment of the invention.
Figure 7:
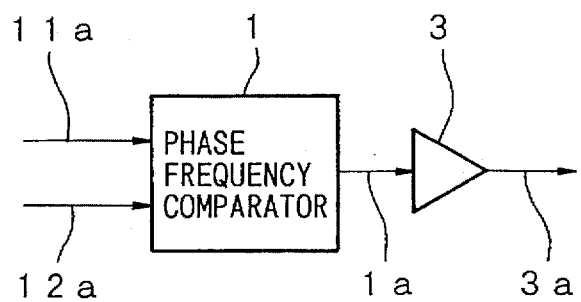
FIG. 7 is a block diagram showing an example of the phase frequency detecting circuit conventionally known.

FIG. 1 shows a phase frequency detecting circuit which is designed in accordance with an embodiment of the invention. In FIG. 1, parts equivalent to those of FIG. 7 are designated by the same numerals; hence, the description thereof will be omitted. In addition to the circuit elements shown in FIG. 7, the phase frequency detecting circuit of FIG. 1 is configured using a phase frequency comparator 2, an integration circuit 4, an offset voltage creating circuit 5, an offset imparting circuit 6, an inverter circuit 7, a frequency divider 8 and a frequency divider 9.

As described before, the phase frequency comparator 1 inputs a base phase 11a and a reference phase 12a so as to produce a phase error signal 1a. The phase error signal 1a is proportional to an input phase difference 1b which corresponds to a difference between the phases 11a and 12a. The integration circuit 3 performs integration on the phase error signal 1a to produce a control voltage 3a. The inverter circuit 7 effects phase inversion on the base phase 11a to produce an inverted base phase 7a. The frequency divider 8 inputs the inverted base phase 7a. Thus, the frequency divider 8 performs a frequency-dividing operation on the inverted base phase 7a to produce a frequency-divided base phase 8a. On the other hand, the frequency divider 9 performs a frequency-dividing operation on the reference phase 12a to produce a frequency-divided reference phase 9a.

The phase frequency comparator 2 inputs the frequency-divided base phase 8a and the frequency-divided reference phase 9a to produce a phase error signal 2a. The phase error signal 2a is proportional to an input phase difference of the phase frequency comparator which corresponds to a difference between the phases 8a and 9a. The integration circuit 4 performs integration on the phase error signal 2a to produce a frequency-divided control voltage 4a. The offset voltage creating circuit 5 inputs the control voltage 3a as well as the frequency-divided control voltage 4a. Thus, a offset voltage 5a is created based on them. The offset imparting circuit 6 imparts the offset voltage 5a to the frequency-divided control voltage 4a so as to produce an output voltage 6a.

Figure 2:
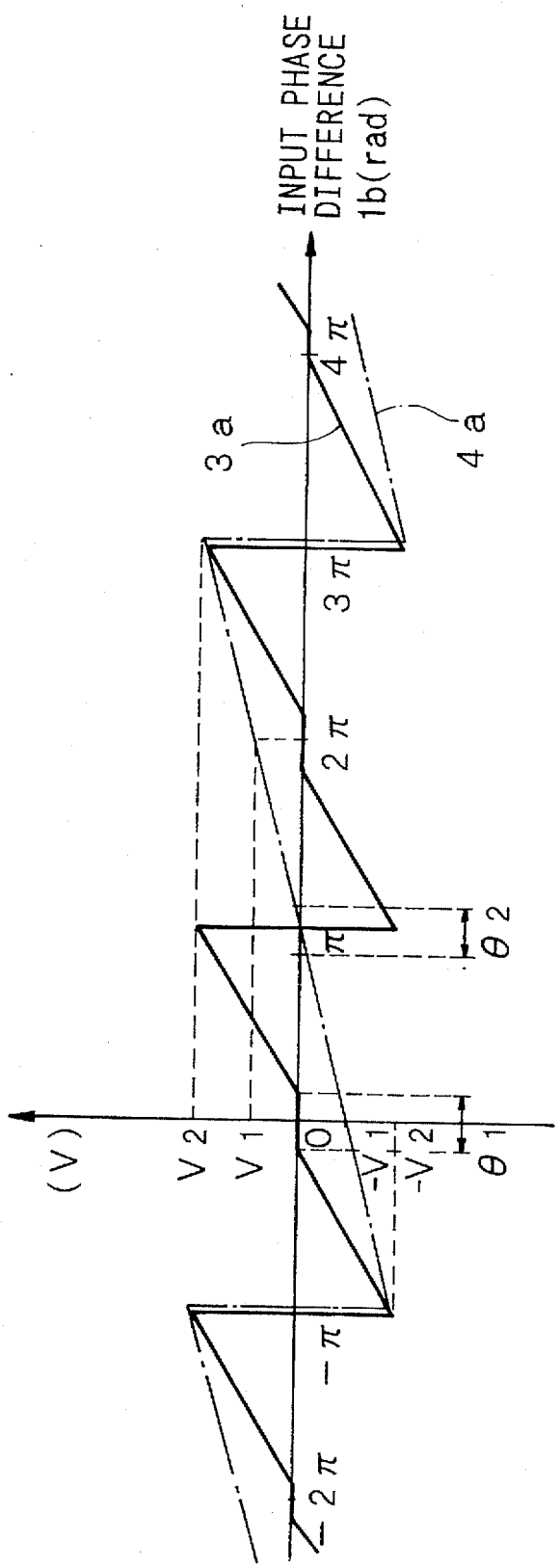
FIG. 2 is a graph showing variations of control voltage and frequency-divided control voltage with respect to an input phase difference in the phase frequency detecting circuit of FIG. 1.

FIG. 2 shows characteristics of the phase frequency detecting circuit with respect to relationships between the input phase difference 1b, the control voltage 3a and the frequency-divided control voltage 4a. In FIG. 2, a solid line represents a characteristic of the control voltage 3a, while a dashed line represents a characteristic of the frequency-divided control voltage 4a. Herein, $V_1$ designates a value of the frequency-divided control voltage 4a which is measured at a moment when the input phase difference 1b is $2\pi$ (rad), while $V_2$ designates a value of the frequency-divided control voltage 4a which is measured at a moment when the input phase difference 1b is $3\pi$ (rad). In addition, $\theta_1$ designates a first phase range which is placed in proximity to a zero point of the input phase difference 1b and at which the control voltage 3a is zero, while $\theta_2$ designates a second phase range which is placed in proximity to a phase point of $\theta$ (rad) of the input phase difference 1b and at which the frequency-divided control voltage 4a is zero. Those ranges $\theta_1$ and $\theta_2$ are called 'dead zones' which are very small. Further, $V_1$ is approximately a half of $V_2$.

Figure 8:
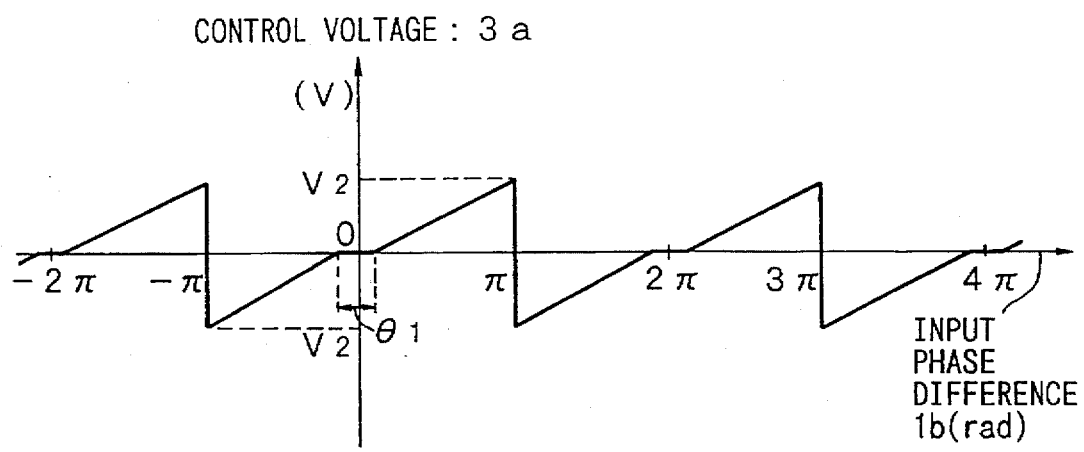
FIG. 8 is a graph showing an input/output characteristic of the phase frequency detecting circuit of FIG. 7.
Figure 9:
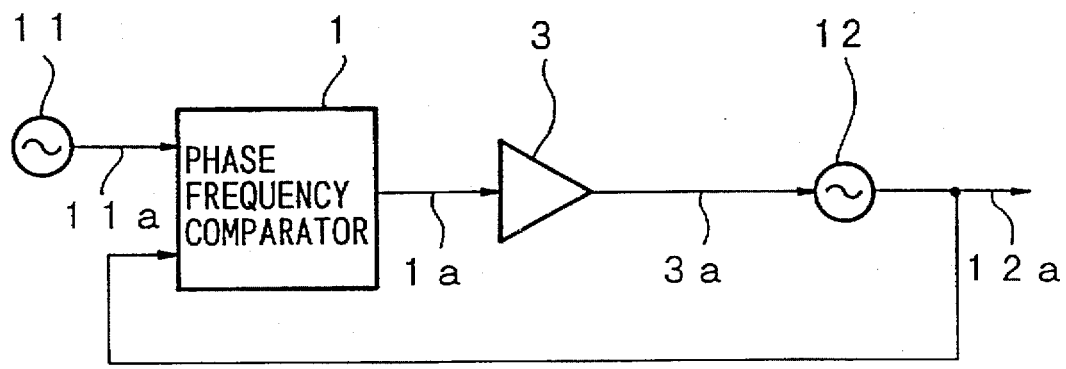
FIG. 9 is a block diagram showing an example of the phase synchronization circuit which employs the phase frequency detecting circuit of FIG. 7.
Figure 10:
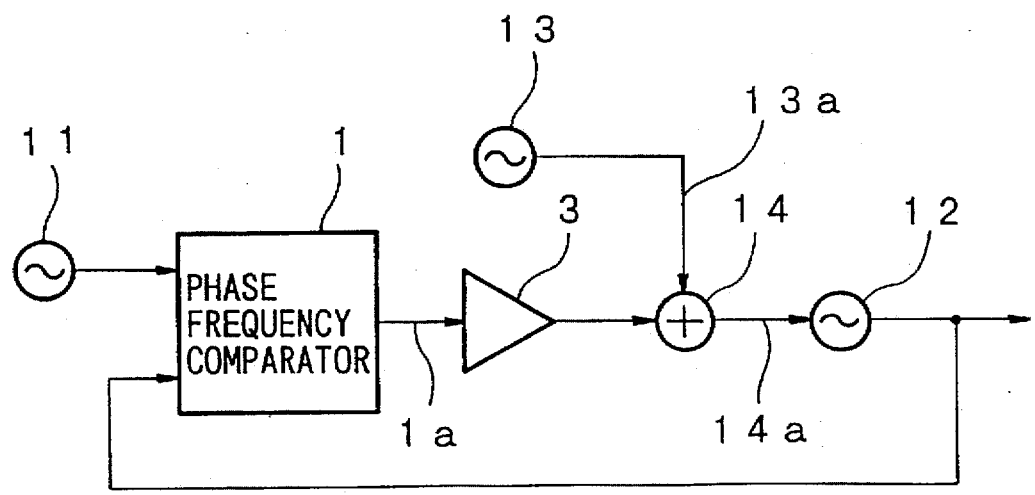
FIG. 10 is a block diagram showing an example of the angle-modulation phase synchronization circuit which employs the phase frequency detecting circuit of FIG. 7.

The frequency-divided control voltage 4a has a maximum value which corresponds to $V_2$. A minimum value of the frequency-divided control voltage 4a is '$-V_2$' whose sign is reverse to a sign of the maximum value '$+V_2$'. In addition, a minimum value of the control voltage 3a is equal to the minimum value '$-V_2$' of the frequency-divided control voltage 4a. The characteristic of the control voltage 3a, shown by the solid line in FIG. 2, is identical to the characteristic shown in FIG. 8.

Meanwhile, a horizontal axis of FIG. 2 represents the input phase difference 1b, wherein a right direction of FIG. 2 corresponds to a positive direction of the input phase difference 1b.

As compared to the control voltage 3a, the frequency-divided control voltage 4a is created by the phase inversion made by the inverter circuit 7. This means that the frequency-divided control voltage 4a is created by subjecting the control voltage 3a to a parallel movement of $\pi$ (rad) in the positive direction of the horizontal axis. Further, a frequency of the frequency-divided control voltage 4a is reduced to a half of a frequency of the control voltage 3a because input phases of the phase frequency comparator 2 are subjected to frequency-dividing operations made by the frequency dividers 8 and 9. This means that a period of the characteristic of the frequency-divided control voltage 4a is doubled as compared to a period of the characteristic of the control voltage 3a.

Figure 3:
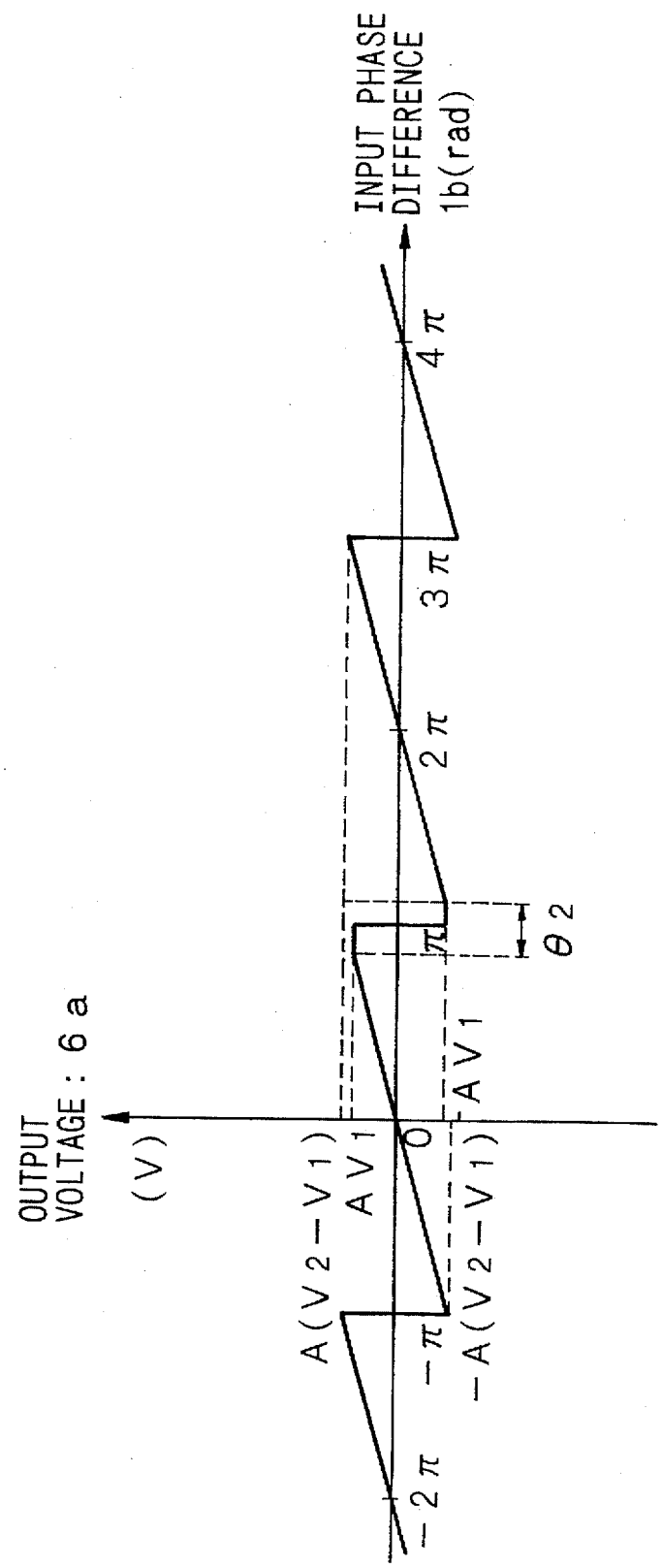
FIG. 3 is a graph showing a relationship between an output voltage and an input phase difference in the phase frequency detecting circuit of FIG. 1.

FIG. 3 shows an input/output characteristic, i.e., a relationship between the input phase difference 1b and the output voltage 6a. $\theta_2$ shown in FIG. 3 is identical to $\theta_2$ shown in FIG. 2. The offset voltage creating circuit 5 subtracts a value of the frequency-divided control voltage 4a from a value of the control voltage 3a. If the result of subtraction is positive, the offset voltage creating circuit 5 outputs offset voltage 5a whose value corresponds to $V_1$ having a plus sign (+). On the other hand, if the result of the subtraction is negative, the offset voltage creating circuit 5 outputs offset voltage 5a whose value corresponds to $V_1$ having a minus sign (−). So, the offset voltage 5a coincides with $V_1$ as long as the input phase difference 1b belongs to a phase range between $-\pi$ (rad) and $\pi$ (rad); and the offset voltage 5a coincides with $-V_1$ as long as the input phase difference 1b belongs to a phase range between $\pi$ (rad) and $3\pi$ (rad).

In the offset imparting circuit 6, the offset voltage 5a is added to the frequency-divided control voltage 4a. In addition, the result of addition is multiplied by a factor 'A' to produce an output voltage 6a. Incidentally, 'A' indicates a real number arbitrarily selected.

A maximum value of the output voltage 6a is presented by a mathematical expression of '$A \times (V_2 - V_1)$', while a minimum value is presented by a mathematical expression of '$-A \times (V_2 - V_1)$'. In the range $\theta_2$, the output voltage 6a is set at '$A \times V_1$' which is slightly lower than the maximum value or '$-A \times V_1$' which is slightly higher than the minimum value. However, the range $\theta_2$ itself is a micro range; therefore, it can be said that values of the output voltage 6a in the range $\theta_2$ are substantially equivalent to the maximum value and minimum value.

A dead zone of the output voltage 6a lies at the input phase difference 1b of $\pi$ (rad). So, the output voltage 6a has a proportional characteristic as long as the input phase difference 1b is set in proximity to zero, wherein linearity is improved. Incidentally, a value of $V_1$ is approximately a half of a value of $V_2$. So, if '2' is set to the factor A, a maximum value of the output voltage 6a is approximately equal to $V_2$, while a minimum value is approximately equal to $-V_2$. In that case, it is possible to avoid deterioration of detection sensitivity for phase differences.

Figure 4:
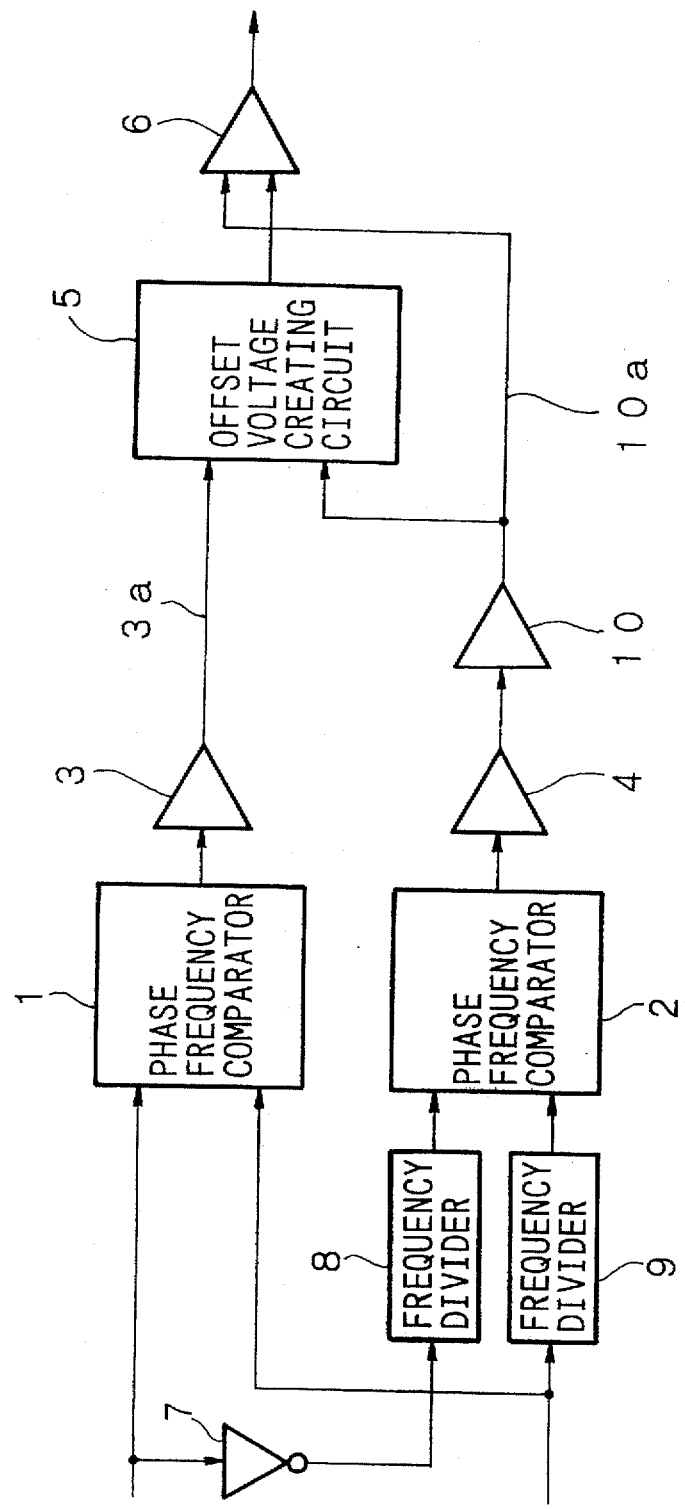
FIG. 4 is a block diagram showing a configuration of a phase frequency detecting circuit which is designed in accordance with another embodiment of the invention.

FIG. 4 shows a phase frequency detecting circuit which is designed in accordance with another embodiment of the invention, wherein parts equivalent to those of FIG. 1 are designated by the same numerals; hence, the description thereof will be omitted. In addition to the circuit elements shown in FIG. 1, the phase frequency detecting circuit of FIG. 4 provides an amplifier 10 to receive an output of the integration circuit 4.

The amplifier 10 amplifies the frequency-divided control voltage 4a by a factor 'B' to produce an amplified output voltage 10a. A waveform of the amplified output voltage 10a is obtained by effecting amplification, using the factor B, on the waveform of the frequency-divided control voltage 4a of FIG. 2 in a direction of the vertical axis. So, a maximum value of the amplified output voltage 10a is presented by a mathematical expression of '$B \times V_2$', while a minimum value is presented by a mathematical expression of '$-B \times V_2$'. When the input phase difference 1b coincides with $2\pi$ (rad), the amplified output voltage 10a coincides with '$B \times V_1$'. Incidentally, the factor B is a real number arbitrarily selected.

In FIG. 4, the offset voltage creating circuit 5 creates an offset voltage based on the control voltage 3a and the amplified output voltage 10a. The offset voltage coincides with '$B \times V_1$' as long as the input phase difference 1b belongs to a phase range between $-\pi$ (rad) and $\pi$ (rad). In addition, the offset voltage coincides with '$-B \times V_1$' as long as the input phase difference 1b belongs to a phase range between $\pi$ (rad) and $3\pi$ (rad).

Further, the offset imparting circuit 6 produces an output voltage based on the offset voltage and the amplified output voltage 10a.

An input/output characteristic of the phase frequency detecting circuit of FIG. 4 can be made by modifying the input/output characteristic shown in FIG. 3. Specifically, a waveform of the output voltage of the offset imparting circuit 6 is obtained by effecting amplification, using the factor B, on the waveform of the output voltage 6a of FIG. 3 in directions of the vertical axis. In addition, a maximum value of the output voltage of the offset imparting circuit 6 coincides with '$A \times B \times (V_2 - V_1)$', while a minimum value coincides with '$-A \times B \times (V_2 - V_1)$'. The offset imparting circuit 6 does not perform amplification using the factor A, but the amplifier 10 performs amplification using the factor B. If '1' is set to the factor A while '2' is set to the factor B, it is possible to avoid deterioration of detection sensitivity for phase differences.

Figure 5:
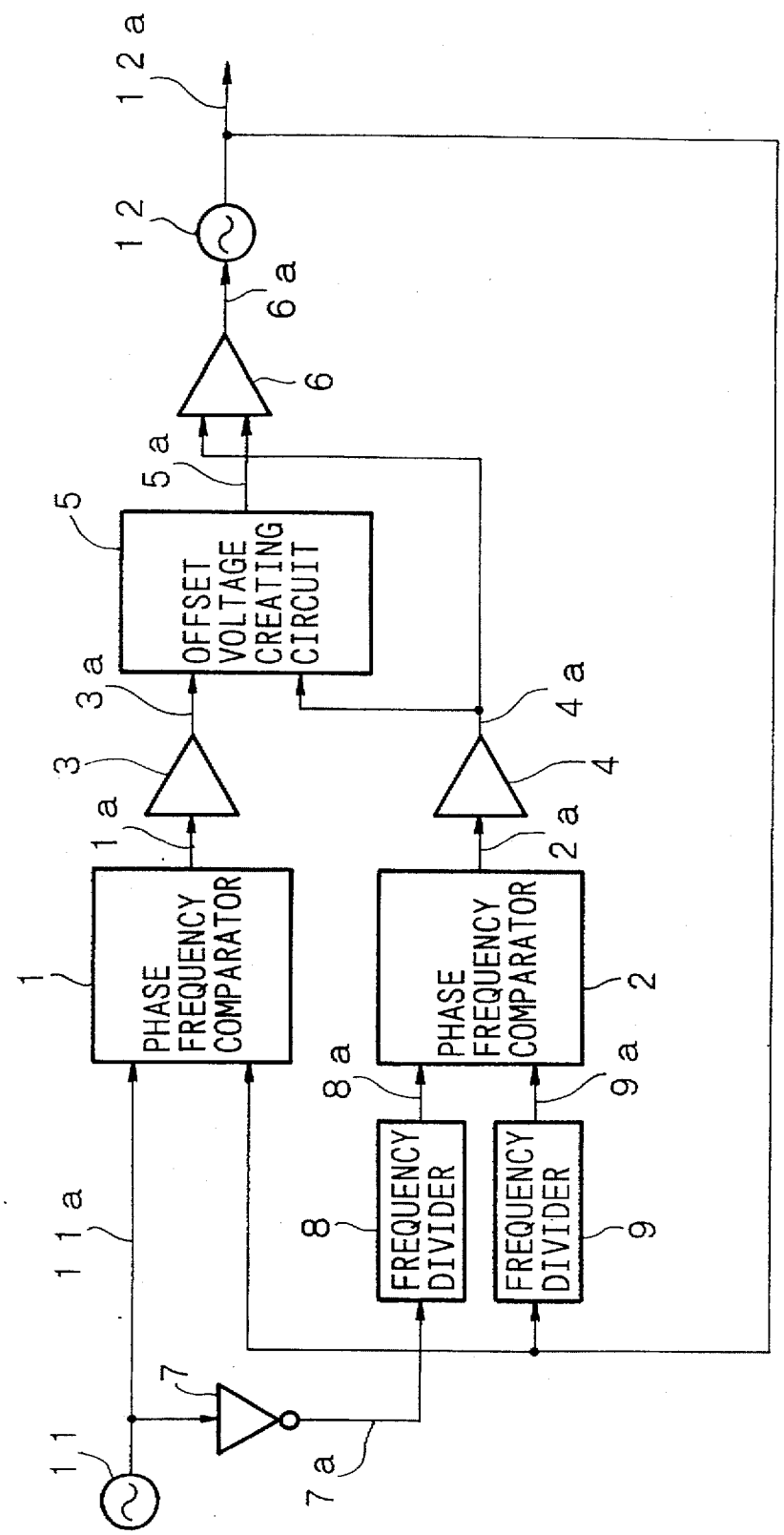
FIG. 5 is a block diagram showing a phase synchronization circuit which employs the phase frequency detecting circuit of FIG. 1.

FIG. 5 shows a phase synchronization circuit which employs the phase frequency detecting circuit of FIG. 1. In addition to the circuit elements shown in FIG. 1, the phase synchronization circuit of FIG. 5 further provides a independent oscillator 11 and a dependent oscillator 12.

The independent oscillator 11 performs oscillation using a constant frequency. The independent oscillator 11 delivers a base phase 11a to the phase frequency comparator 1 and the inverter circuit 7. The dependent oscillator 12 outputs a reference phase 12a while oscillation frequency thereof is controlled by the output voltage 6a. The reference phase 12a is delivered to the phase frequency comparator 1 and the frequency divider 9. The output voltage 6a works to match the base phase 11a outputted from the independent oscillator 11 with the reference phase 12a outputted from the dependent oscillator 12.

If the base phase 11a is matched with the reference phase 12a so that the phase synchronization circuit of FIG. 5 is put in a phase-synchronized state, the input phase difference 1b becomes equal to zero. So, even if the reference phase 12a fluctuates so that the input phase difference 1b correspondingly fluctuates between the positive and negative, the output voltage 6a still belongs to a range of the proportional characteristic. Thus, it is possible to detect the input phase difference 1b. In short, it is possible to reduce jitter which occurs in the reference phase 12a outputted from the dependent oscillator 12.

Figure 6:
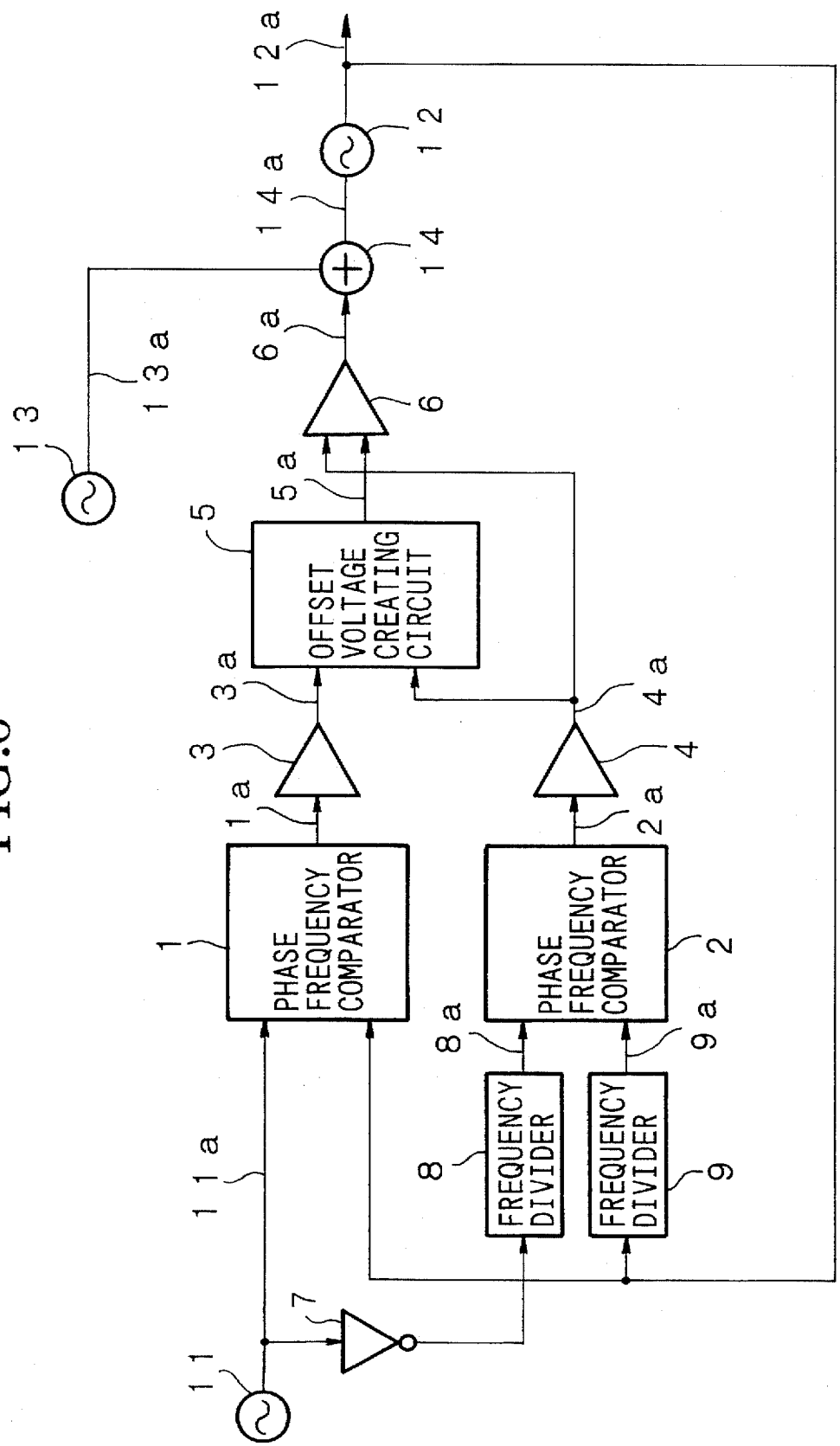
FIG. 6 is a block diagram showing an angle-modulation phase synchronization circuit which employs the phase frequency detecting circuit of FIG. 1.

FIG. 6 shows an angle-modulation phase synchronization circuit which employs the phase frequency detecting circuit of FIG. 1. In addition to the circuit elements shown in FIG. 5, the angle-modulation phase synchronization circuit of FIG. 6 further provides an angle-modulation oscillator 13 and an addition circuit 14.

The angle-modulation oscillator 13 produces a modulation signal 13a. The addition circuit 14 adds the modulation signal 13a to the output voltage 6a so as to produce an addition voltage 14a. The dependent oscillator 12 produces a reference phase 12a based on the addition voltage 14.

If the base phase 11a is matched with the reference phase 12a so that the angle-modulation phase synchronization circuit of FIG. 6 is put in a phase-synchronized state, the input phase difference 1b becomes equal to zero. Thus, the output voltage 6a becomes equal to zero correspondingly. So, even if the reference phase 12a fluctuates so that the input phase difference 1b fluctuates between the positive and negative, the output voltage 6a still belongs to a range of the proportional characteristic. Thus, it is possible to detect the input phase difference 1b. As a result, it is possible to reduce jitter which occurs in the reference phase 12a outputted from the dependent oscillator 12.

The dependent oscillator 12 is subjected to angle modulation, such as frequency modulation and phase modulation, by the modulation signal 13a. Due to the modulation signal 13a, variation of the input phase difference 1b in the positive or negative direction is forced to belong to a range of the proportional characteristic. In short, it is possible to avoid occurrence of modulation distortion.

The phase synchronization circuit of FIG. 5 and the angle-modulation phase synchronization circuit of FIG. 6 are designed to employ the phase frequency detecting circuit of FIG. 1. However, those circuits can be re-designed to employ the phase frequency detecting circuit of FIG. 4.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within meets and bounds of the claims, or equivalence of such meets and bounds are therefore intended to be embraced by the claims.

What is claimed is:

1. A phase frequency detecting circuit comprising:

a first phase frequency comparator for producing a first phase error signal which is proportional to a difference between a base phase and a reference phase inputted thereto;

a first integration circuit for performing integration on the first phase error signal to produce a control voltage;

an inverter circuit for effecting phase inversion on the base phase to produce an inverted base phase;

a first frequency divider for performing a frequency dividing operation on the inverted base phase to produce a frequency-divided base phase;

a second frequency divider for performing a frequency dividing operation on the reference phase to produce a frequency-divided reference phase;

a second phase frequency comparator for producing a second phase error signal which is proportional to a difference between the frequency-divided base phase and the frequency-divided reference phase;

a second integration circuit for performing integration on the second phase error signal to produce a frequency-divided control voltage;

an offset voltage creating circuit for producing an offset voltage based on the control voltage and the frequency-divided control voltage; and an offset imparting circuit, receiving said offset voltage and said frequency-divided control voltage, for imparting the offset voltage to the frequency-divided control voltage to produce an output voltage.

2. A phase frequency detecting circuit as defined in claim 1 further comprising an amplifier which amplifies the frequency-divided control voltage, outputted from the second integration circuit, to produce an amplified output voltage, wherein the amplified output voltage is used instead of the frequency-divided control voltage and is delivered to the offset voltage creating circuit and the offset imparting circuit.

3. A phase synchronization circuit comprising:

a first phase frequency comparator for producing a first phase error signal which is proportional to a difference between a base phase and a reference phase inputted thereto;

a first integration circuit for performing integration on the first phase error signal to produce a control voltage;

an inverter circuit for effecting phase inversion on the base phase to produce an inverted base phase;

a first frequency divider for performing a frequency dividing operation on the inverted base phase to produce a frequency-divided base phase;

a second frequency divider for performing a frequency dividing operation on the reference phase to produce a frequency-divided reference phase;

a second phase frequency comparator for producing a second phase error signal which is proportional to a difference between the frequency-divided base phase and the frequency-divided reference phase;

a second integration circuit for performing integration on the second phase error signal to produce a frequency-divided control voltage;

an offset voltage creating circuit for producing an offset voltage based on the control voltage and the frequency-divided control voltage;

an offset imparting circuit, receiving said offset voltage and said frequency-divided control voltage, for imparting the offset voltage to the frequency-divided control voltage to produce an output voltage; and a dependent oscillator whose oscillation frequency is controlled by the output voltage of the offset imparting circuit to produce the reference phase.

4. An angle-modulation phase synchronization circuit comprising:

a first phase frequency comparator for producing a first phase error signal which is proportional to a difference between a base phase and a reference phase inputted thereto;

a first integration circuit for performing integration on the first phase error signal to produce a control voltage;

an inverter circuit for effecting phase inversion on the base phase to produce an inverted base phase;

a first frequency divider for performing a frequency dividing operation on the inverted base phase to produce a frequency-divided base phase;

a second frequency divider for performing a frequency dividing operation on the reference phase to produce a frequency-divided reference phase;

a second phase frequency comparator for producing a second phase error signal which is proportional to a difference between the frequency-divided base phase and the frequency-divided reference phase;

a second integration circuit for performing integration on the second phase error signal to produce a frequency-divided control voltage;

an offset voltage creating circuit for producing an offset voltage based on the control voltage and the frequency-divided control voltage;

an offset imparting circuit, receiving said offset voltage and said frequency-divided control voltage, for imparting the offset voltage to the frequency-divided control voltage to produce an output voltage;

an angle-modulation oscillator for producing a modulation signal;

an addition circuit for adding the modulation signal to the output voltage of the offset imparting circuit to produce an addition voltage; and a dependent oscillator whose oscillation frequency is controlled by the addition voltage of the addition circuit to produce the reference phase which is subjected to angle modulation by the modulation signal.

5. An angle-modulation phase synchronization circuit as defined in claim 4 wherein the angle modulation is either frequency modulation or phase modulation.

6. A phase frequency detecting circuit comprising:

a first phase frequency comparator for producing a first phase error signal which is proportional to an input phase difference between a base phase and a reference phase;

a first integration circuit for performing integration on the first phase error signal to produce a first control voltage;

first phase creating means for creating a first phase which is inverse to the base phase and whose frequency is an integral submultiple of a frequency of the base phase;

second phase creating means for creating a second phase whose frequency is an integral submultiple of a frequency of the reference phase;

a second phase frequency comparator for producing a second phase error signal which is proportional to a phase difference between the first phase and the second phase;

a second integration circuit for performing integration on the second phase error signal to produce a second control voltage;

an offset voltage creating circuit for creating an offset voltage whose value is determined in response to the second control voltage, wherein the offset voltage is created together with a sign which is determined responsive to a relationship between the first control voltage and the second control voltage; and offset imparting circuit for adding the offset voltage to the second control voltage, so that output voltage of the offset imparting circuit is produced by amplifying result of addition by a factor arbitrarily selected.

7. A phase frequency detecting circuit as defined in claim 6 further comprising an amplifier for amplifying the second control voltage by a factor arbitrarily selected to produce a third control voltage, so that the third control voltage is used instead of the second control voltage and is delivered to the offset voltage creating circuit and the offset imparting circuit.

8. A phase frequency detecting circuit as defined in claim 6 wherein the first phase creating means and the second phase creating means are designed to perform frequency dividing operations respectively such that a frequency of the first control voltage becomes substantially double of a frequency of the second control voltage.

* * * * *